United States Patent
Yang et al.

(10) Patent No.: US 11,081,043 B2
(45) Date of Patent: Aug. 3, 2021

(54) ARRAY SUBSTRATE, DISPLAY PANEL AND DISPLAY DEVICE

(71) Applicant: WUHAN CHINA STAR OPTOELECTRONICS TECHNOLOGY CO., LTD., Hubei (CN)

(72) Inventors: Chaoqun Yang, Hubei (CN); Changchih Huang, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 0 days.

(21) Appl. No.: 16/772,848

(22) PCT Filed: Feb. 10, 2020

(86) PCT No.: PCT/CN2020/074647
§ 371 (c)(1),
(2) Date: Jun. 15, 2020

(87) PCT Pub. No.: WO2021/031534
PCT Pub. Date: Feb. 25, 2021

(65) Prior Publication Data
US 2021/0125540 A1    Apr. 29, 2021

(51) Int. Cl.
*H05K 1/02*    (2006.01)
*G09G 3/20*    (2006.01)

(52) U.S. Cl.
CPC ......... *G09G 3/2092* (2013.01); *H05K 1/0259* (2013.01)

(58) Field of Classification Search
CPC ......... G09G 2300/0426; G09G 3/3233; G09G 2380/02; G09G 3/3275; G09G 3/3666; G09G 2310/0264; G09G 2330/04; G06F 2203/04103; G02F 1/13454; G02F 1/133305; G02F 2201/123; G02F 1/13458; G02F 1/133388; H01L 27/3276;
(Continued)

(56) References Cited

U.S. PATENT DOCUMENTS

2014/0126228 A1 *  5/2014  Lee .......................... F21V 21/00
                                                              362/382
2015/0036300 A1 *  2/2015  Park ..................... H01L 51/0097
                                                              361/749
(Continued)

FOREIGN PATENT DOCUMENTS

CN       104503122 A      4/2015
CN       108535907 A      9/2018
(Continued)

*Primary Examiner* — Duc Q Dinh
(74) *Attorney, Agent, or Firm* — Mark M. Friedman

(57) ABSTRACT

The application provides an array substrate, a display panel, and a display device. The display panel comprises the support plate and the array substrate. The backlight surface of the flexible driving circuit substrate of the array substrate is bonded to the support plate in the display area. The area where the flexible driving circuit substrate is provided with the gate driving circuit and the data driving circuit is bent and attached to the other surface of the support plate. The light emitting surface of the display panel only has a display area capable of displaying pictures, which alleviates the problem that the existing display panel cannot fully display.

12 Claims, 6 Drawing Sheets

(58) Field of Classification Search
CPC ......... H01L 51/0097; H01L 2251/5338; H01L 27/3248; H01L 27/3262; H01L 25/0753; H01L 27/3272; H01L 27/14636; H01L 27/3209; H01L 27/156
USPC .................................................. 345/98–102
See application file for complete search history.

(56) References Cited

U.S. PATENT DOCUMENTS

| | | | |
|---|---|---|---|
| 2017/0046001 A1* | 2/2017 | Katsuta | G09G 3/3611 |
| 2017/0076687 A1 | 3/2017 | Shanghai Tianma Microelectronics Co Ltd Etc | |
| 2017/0162605 A1* | 6/2017 | Yamamoto | G09G 3/3677 |
| 2019/0302529 A1* | 10/2019 | Zha | G02F 1/133305 |

FOREIGN PATENT DOCUMENTS

| | | |
|---|---|---|
| CN | 108648710 A | 10/2018 |
| CN | 108803103 A | 11/2018 |
| CN | 108847176 A | 11/2018 |
| CN | 109459878 A | 3/2019 |
| JP | H11288003 A | 10/1999 |
| KR | 20140108826 A | 9/2014 |

\* cited by examiner

ARRAY SUBSTRATE, DISPLAY PANEL AND DISPLAY DEVICE

This application claims priority to Chinese Patent Application No. 201910780820.X, titled "Array Substrate, Display Panel and Display Device", filed with National Intellectual Property Administration on Aug. 22, 2019, the disclosure, which is incorporated herein by reference in its entirety.

BACKGROUND OF INVENTION

Field of Invention

The present application relates to the field of display field, and particularly, to an array substrate, a display panel, and a display device.

Description of Prior Art

In pursuit of a better user experience of display panels, a full screen has become the focus of scientific research.

However, because technology has its limits, only ultra-high screen ratio displays can be achieved for the time being, that is, display screens still have a narrow bezel design, which cannot achieve a full screen display with a front screen ratio of 100%.

Therefore, a problem that existing display panels cannot achieve full display needs to be resolved.

SUMMARY OF INVENTION

The present application provides an array substrate, a display panel, and a display device to solve the problem that the existing display panel cannot achieve full display.

The present application provides an array substrate, comprising: a substrate; a flexible driving circuit substrate provided with a pixel driving circuit located in a display area; a gate driving circuit located in an area of at least one of left and right side of the display area; and a data driving circuit located in an area below the display area.

In the array substrate provided in the present application, the gate driving circuit is disposed in an area located on one of the left and right side of the display area.

In the array substrate provided in the present application, the gate driving circuit is disposed in an area located on the left side of the display area.

In the array substrate provided in the present application, the gate driving circuit is disposed in an area located on the right side of the display area.

In the array substrate provided in the present application, the gate driving circuit is disposed in areas located on the left and right side of the display area.

In the array substrate provided in the present application, the flexible driving circuit substrate is also provided with an electrostatic discharge circuit.

In the array substrate provided in the present application, the gate driving circuit is disposed in an area located on one of the left and right side of the display area; the electrostatic discharge circuit is disposed in an area located on a side of the left and right side of the display area where the gate driving circuit is not provided, and at least one of areas located on an upper side of the display area.

In the array substrate provided in the present application, the gate driving circuit is disposed in areas located on the left and right side of the display area, and the electrostatic discharge circuit is disposed in an area located on the upper side of the display area.

At the same time, the present application provides a display panel, comprising: a support plate; an array substrate comprising a flexible driving circuit substrate, provided with a pixel driving circuit located in a display area, a gate driving circuit located in an area of at least one of left and right sides of the display area, and a data driving circuit located in an area below the display area; a backlight surface of the flexible driving circuit substrate is bonded to the support plate in the display area; and an area of the flexible driving circuit substrate provided with the gate driving circuit and the data driving circuit is bonded to the other surface of the support plate after being partially bent.

In the display panel provided in the present application, the gate driving circuit is disposed in an area located on one of the left and right side of the display area.

In the display panel provided in the present application, the gate driving circuit is disposed in an area located on the left side of the display area.

In the display panel provided in the present application, the gate driving circuit is disposed in areas located on the right side of the display area.

In the display panel provided in the present application, the gate driving circuit is disposed in an area located on the left and right side of the display area.

In the display panel provided in the present application, the flexible driving circuit substrate is also provided with an electrostatic discharge circuit.

In the display panel provided in the present application, the gate driving circuit is disposed in an area located on one of the left and right side of the display area; the electrostatic discharge circuit is disposed in an area located on a side of the left and right side of the display area where the gate driving circuit is not provided, and at least one of areas located on an upper side of the display area; an area where the electrostatic discharge circuit is provided is bonded to the other surface of the support plate after being partially bent.

In the display panel provided in the present application, the gate driving circuit is disposed in areas located on the left and right side of the display area, and the electrostatic discharge circuit is disposed in an area located on the upper side of the display area; and an area where the electrostatic discharge circuit is provided is bonded to the other surface of the support plate after being partially bent.

In the display panel provided in the present application, a size of the support plate is smaller than a size of the display area.

In the display panel provided in the present application, material of the support plate is any one of glass, polyimide, polyethylene terephthalate, or polyaluminum chloride.

In the display panel provided in the present application, the flexible driving circuit substrate comprises a flexible substrate and a thin film transistor layer, and the pixel driving circuit is composed of thin film transistors in the thin film transistor layer.

At the same time, the present application also provides a display device, comprising a display panel wherein the display panel comprises: a support plate; an array substrate comprises a flexible driving circuit substrate, provided with a pixel driving circuit located in a display area, a gate driving circuit located in an area of at least one of left and right sides of the display area, and a data driving circuit located in an area below the display area; a backlight surface of the flexible driving circuit substrate is bonded to the support plate in the display area; an area of the flexible driving circuit substrate provided with the gate driving circuit and the data driving circuit is bonded to the other surface of the support plate after being partially bent.

The application provides an array substrate, a display panel, and a display device. The array substrate comprises a substrate and a flexible driving circuit substrate. The display panel comprises a support plate and the array substrate. The array substrate comprises a flexible driving circuit substrate and a backlight surface of the flexible driving circuit substrate is bonded to the support plate in the display area. An area of the flexible driving circuit substrate provided with a gate driving circuit and a data driving circuit is bonded to the other surface of the support plate after being partially bent. In this way, only the display area of the display panel can be maintained on the light emitting surface of the display panel, which greatly improves the screen ratio of the entire display panel and alleviates the problem that existing display panels cannot be fully displayed.

DETAILED DESCRIPTION OF PREFERRED EMBODIMENTS

In view of the problem that existing display panels cannot achieve full display, the present application provides an array substrate, a display panel, and a display device to alleviate this problem.

Figure 1:
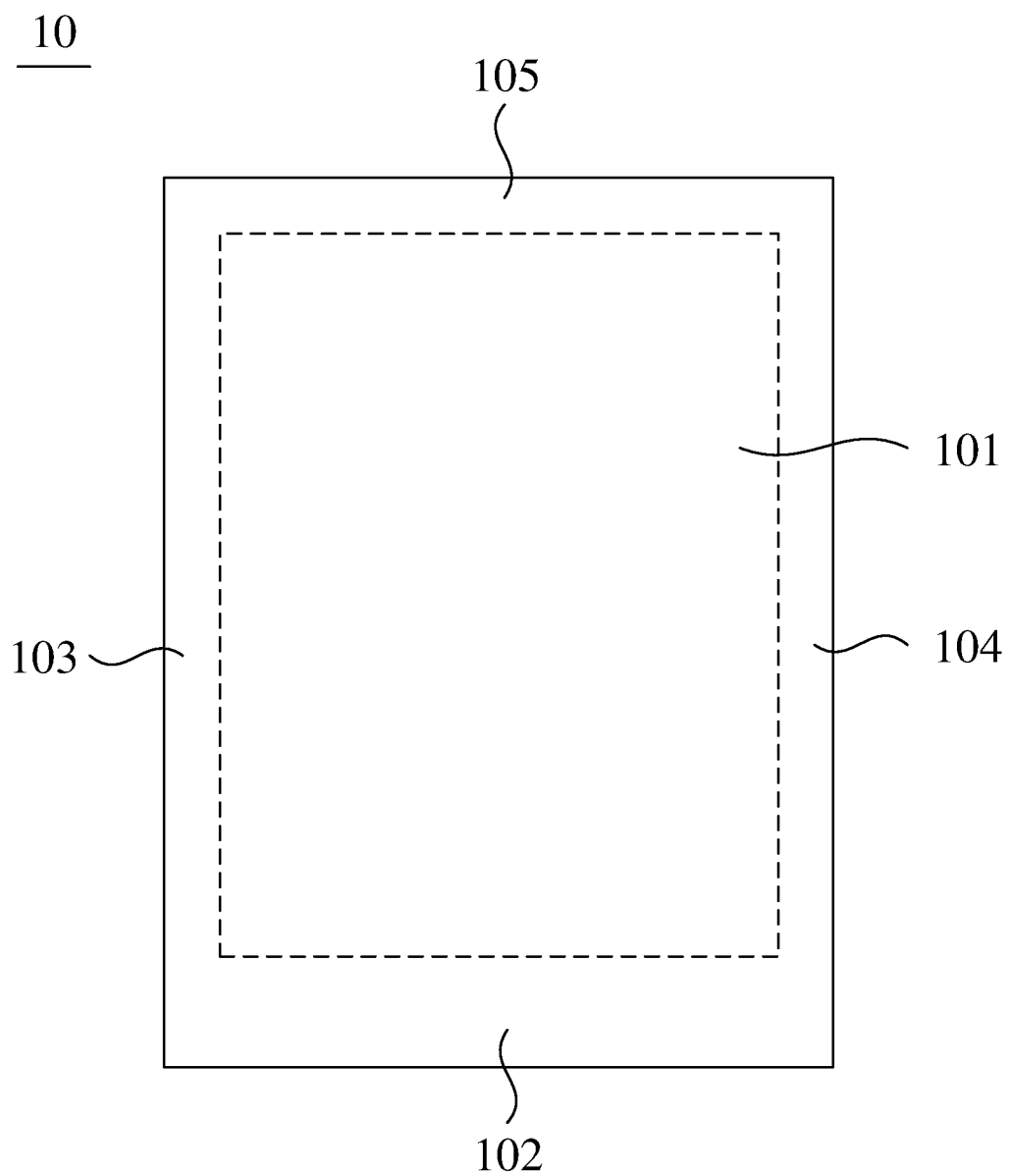
FIG. 1 is a schematic top diagram of an array substrate provided by an embodiment of the present application.
Figure 2:
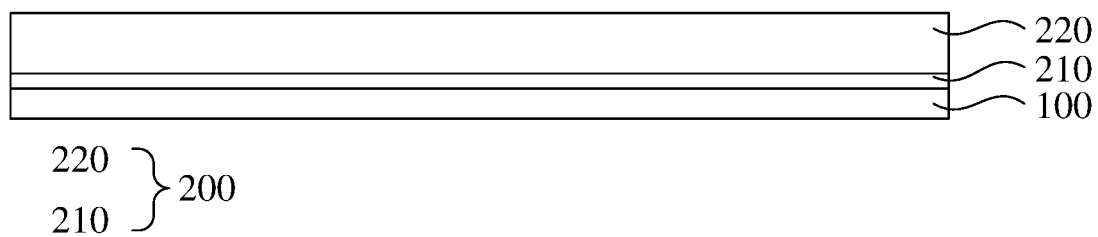
FIG. 2 is a schematic structural diagram of the array substrate provided by the embodiment of the present application.

In one embodiment, as shown in FIG. 1 and FIG. 2, the array substrate 10 provided in the application comprises: a substrate 100; a flexible driving circuit substrate 200 provided with a pixel driving circuit located in a display area 101; a gate driving circuit located in an area of at least one of left and right side of the display area 101; and a data driving circuit located in an area 102 below the display area 101.

An embodiment of the present application provides an array substrate, and by setting the array substrate to be flexible, it provides a prerequisite for the bending of the array substrate in a subsequent display panel manufacturing process.

In one embodiment, a gate driving circuit is disposed in an area located on one of the left and right side of the display area 101. The gate driving circuit may be provided in an area 103 located on the left side of the display area 101, or may be provided in an area 104 located on the right side of the display area 101.

In another embodiment, a gate driving circuit is disposed in an area 103 and 104 located on the left and right side of the display area 101.

In one embodiment, the flexible driving circuit substrate is also provided with an electrostatic discharge circuit.

When the gate driving circuit is disposed in an area on one of the left and right side of the display area 101, the electrostatic discharge circuit is disposed in at least one of an area located on a side of the display area 101 where the gate driving circuit is not provided and an area 105 located on an upper side of the display area 101. When the gate driving circuit is disposed in the area 103 located on the left side of the display area 101, the electrostatic discharge circuit can be disposed in the area 104 located on the right side of the display area 101 or in the area 105 on the upper side of the display area 101, and it can also be disposed in the area 104 located on the right side of the display area 101 and the area 105 on the upper side of the display area 101 at the same time; when the gate driving circuit is disposed in the area 104 located on the right side of the display area 101, the electrostatic discharge circuit can be disposed in the area 103 located on the left side of the display area 101 or in the area 105 located on the upper side of the display area 101, and it can also be disposed in the area 104 located on the right side of the display area 101 and the area 105 on the upper side of the display area 101 at the same time.

When the gate driving circuit is disposed in the areas 103 and 104 located on the left and right side of the display area 101, the electrostatic discharge circuit is disposed in the area 105 on the upper side of the display area 101.

In one embodiment, as shown in FIG. 2, the flexible driving circuit substrate comprises a flexible substrate 210 and a thin film transistor layer 220. The pixel driving circuit is composed of thin film transistors in the thin film transistor layer 220. The material of the flexible substrate is polyimide or polyethylene terephthalate.

Figure 3:
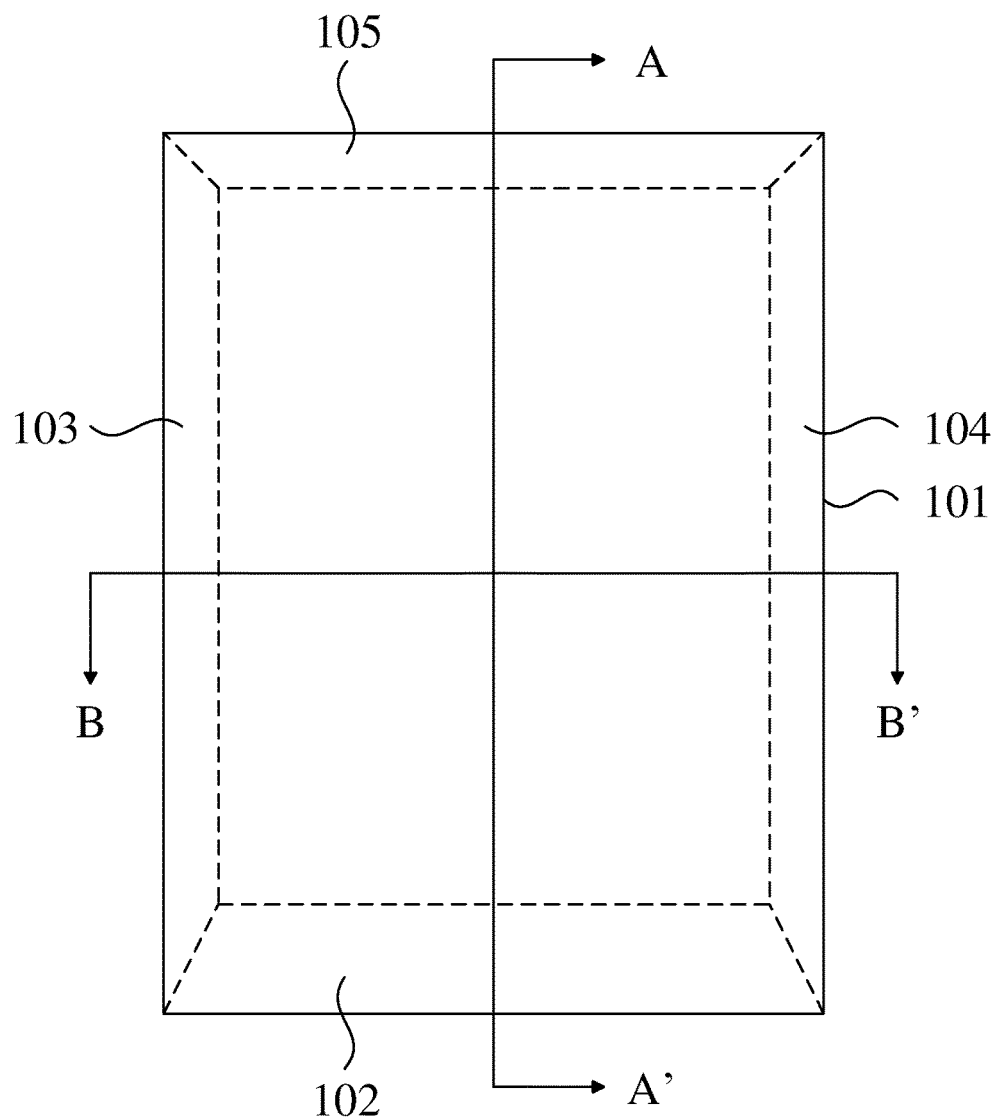
FIG. 3 is a schematic top diagram of a display panel provided by an embodiment of the present application.
Figure 4:
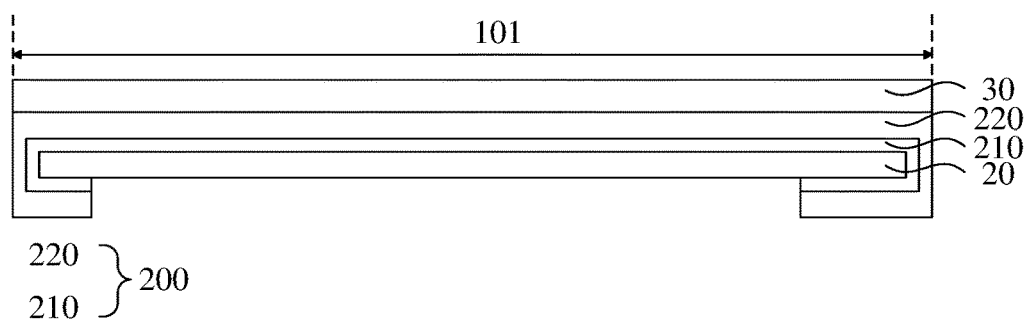
FIG. 4 is a schematic cross-sectional diagram of the display panel taken along A-A' according to an embodiment of the present application.
Figure 5:
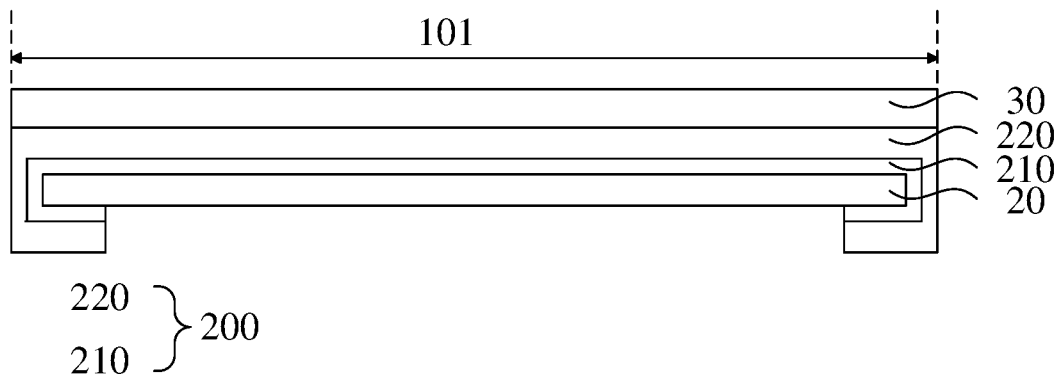
FIG. 5 is a schematic cross-sectional diagram of the display panel taken along B-B' according to an embodiment of the present application.

In an embodiment, as shown in FIG. 3 to FIG. 5, the display panel provided in this application comprises: a support plate 20; an array substrate 10 comprising a flexible driving circuit substrate 200 provided with a pixel driving circuit located in a display area 101, a gate driving circuit located in an area of at least one of left and right side of the display area 101, and a data driving circuit located in an area 102 below the display area 101; a backlight surface of the flexible driving circuit substrate 200 bonded to the support plate 20 in the display area 101; and an area of the flexible driving circuit substrate 200 provided with the gate driving circuit and the data driving circuit bonded to other surface of the support plate 20 after being partially bent.

An embodiment of the present application provides a display panel including a support plate and an array substrate. The array substrate has a rigid substrate removed, a flexible driving circuit substrate retained, and a gate driving circuit and a data driving circuit provided in the flexible driving circuit substrate. Area, which is partially bent and attached to the other side of the support plate; this way, only the display area of the display panel can be displayed on the light-emitting surface of the display panel, which greatly increases the screen ratio of the entire display panel and eases the existing display panel. Problems that cannot be fully displayed.

In one embodiment, a gate driving circuit is disposed in an area located on one of the left and right side of the display area 101. The gate driving circuit may be provided in an area 103 located on the left side of the display area 101, or may be provided in an area 104 located on the right side of the display area 101. An area where the gate driving circuit is provided is bonded to the other surface of the support plate 20 after being partially bent.

In another embodiment, a gate driving circuit is disposed in an area 103 and 104 located on the left and right side of the display area 101. The areas 103 and 104 are attached to the other side of the support plate 20 after being partially bent, as shown in FIG. 5.

In one embodiment, the flexible driving circuit substrate is also provided with an electrostatic discharge circuit.

When the gate driving circuit is disposed in an area on one of the left and right side of the display area 101, the electrostatic discharge circuit is disposed in at least one of an area located on a side of the display area 101 where the gate driving circuit is not provided and an area 105 located on an upper side of the display area 101.

When the gate driving circuit is disposed in the area 103 located on the left side of the display area 101, the electrostatic discharge circuit can be disposed in the area 104 located on the right side of the display area 101 or in the area 105 on the upper side of the display area 101, and it can also be disposed in the area 104 located on the right side of the display area 101 and the area 105 on the upper side of the display area 101 at the same time; when the gate driving circuit is disposed in the area 104 located on the right side of the display area 101, the electrostatic discharge circuit can be disposed in the area 103 located on the left side of the display area 101 or in the area 105 located on the upper side of the display area 101, and it can also be disposed in the area 104 located on the right side of the display area 101 and the area 105 on the upper side of the display area 101 at the same time; and the area where the flexible driving circuit substrate 200 is provided with the gate driving circuit, the data driving circuit, and the electrostatic discharge circuit is bonded to the other surface of the support plate 20 after being partially bent. For details, refer to FIG. 4 or FIG. 5.

When the gate driving circuit is disposed in the areas 103 and 104 located on the left and right side of the display area 101, the electrostatic discharge circuit is disposed in the area 105 on the upper side of the display area 101; the flexible driving circuit substrate 200 is provided with the area 102 of the data driving circuit; and the areas 103 and 104 provided with the gate driving circuit and the area 105 provided with the electrostatic discharge circuit are bonded to the other side of the support plate 20 after being partially bent, as shown in FIGS. 4 and 5.

In one embodiment, the support plate 20 is used to support the entire display panel, and the material is one of glass, polyimide, polyethylene terephthalate, or polyaluminum chloride. For example, the support plate is the glass substrate and needs to be deburred to prevent burrs on the lower surface or sides of the support plate. The flexible driving circuit substrate is scratched during the bending and bonding process, which affects the quality of the entire display panel.

In one embodiment, a size of the support plate 20 is slightly smaller than a size of the display panel display area 101. This is because there is a certain thickness of the flexible driving circuit substrate in the bending part. The distance between the film layer closer to the inside of the bend and the support plate is closer, and the distance between the film layer closer to the outside of the bend and the support plate is farther. The bending dimension of the film structure on the inside of the bend is smaller than the bending dimension of the film structure on the outside of the bend. Therefore, it is necessary to set the size of the support plate 20 to be slightly smaller than the size of the display area 101 in order to leave a bending position for the film layer located inside the bend. On the basis of not affecting the film structure of the display area 101 of the display panel, the size of the support plate 20 can be reduced as much as possible to ensure that only the display area 101 remains in the front viewing angle after the flexible driving circuit substrate is bent. In addition, it is necessary to ensure that the size of the support plate 20 is not too small, so as not to affect the supporting effect of the support plate 20. The specific size setting can be designed according to specific needs, which is not limited here.

In one embodiment, the flexible driving circuit substrate 200 comprises a flexible substrate 210 and a thin film transistor layer 220. The pixel driving circuit is composed of thin film transistors in the thin film transistor layer 220. The thin film transistor comprises a source electrode, a drain electrode, a gate electrode, and a patterned active semiconductor. The material of the flexible substrate 210 is any one of materials such as polyimide, polyethylene terephthalate, polypropylene resin, or acrylic resin and may also be other bendable materials suitable for preparing flexible substrates, but are not restricted here.

In one embodiment, the data driving circuit traces are disposed on the same layer as the source and drain of the thin film transistor, and the data driving circuit traces are connected to the source or drain in the thin film transistor. The gate driving circuit traces can be set on the same layer as the source and drain of the thin film transistor or can be set on the same layer as the gate of the thin film transistor.

In one embodiment, the display panel further comprises a data driving chip and a gate driving chip (not shown). The data driving chip is bonded to the area 102, and the data driving chip is connected to the data driving circuit so as to input a data signal to the source or drain of the thin film transistor; the gate drive chip can be bound to the area 103, the area 104, or the area 102, and the gate driving chip is connected to the gate driving circuit to input a scan signal to the gate of the thin film transistor.

The driving chip packaging method comprises COG method, COF method, and COP method. The COG method is a traditional packaging method. Driving chips are directly bound to the glass surface of the display panel for packaging. Before the full-screen sets a trend, basically all mobile phones used the COG packaging process, and chips are directly bound to a glass surface. This packaging method can greatly reduce the volume of the entire module and has the clear advantages of high yield, low cost, and easy mass production. The COF packaging process is a flexible film structure that fixes screen chips and parts of wiring to a flexible circuit board, and a flexible additional circuit board (FPC) is used as a package chip carrier. The packaging technology combines the chip and the flexible substrate circuit, the flexible circuit board can be bent so that it can be stacked behind the screen to reduce the chip and partial wiring area of the screen. The COP method is to bend the lower part of the display panel along with the chip and the entire wiring area to the back of the display panel, thereby achieving packaging the upper, lower, left and right bezel of the display panel in a same width.

No matter it is a COG chip packaging method, a COF chip packaging method, or a COP chip packaging method, the embodiments of the present application provide a display panel, which can realize a region where a data driving circuit, a gate driving circuit, and an electrostatic discharge circuit are provided on the side of the display area. It is curved and placed on the backlight side of the display panel so that only the display area of the display panel can be displayed on the light-emitting surface of the display panel, which greatly increases the screen ratio of the entire display panel and alleviates the problem that existing display panels cannot be fully displayed.

The display panel provided in the application may be an OLED display panel or an LCD display panel. The following will further explain the display panel provided by the present application with specific panel types and specific embodiments.

Figure 6:
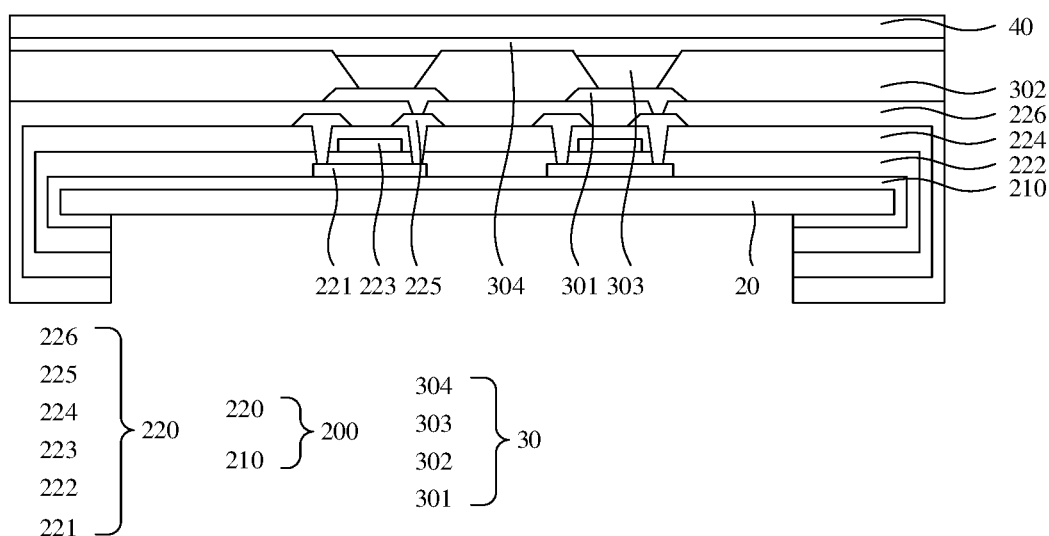
FIG. 6 is a schematic diagram of a first structure of the display panel provided by an embodiment of the present application.

In one embodiment, the display panel provided in this application is an OLED display panel. As shown in FIG. 6, the OLED display panel comprises:

An array substrate 10 comprises a flexible substrate 210 and a thin film transistor layer 220. The thin film transistor layer 220 comprises an active layer, a gate insulating layer 222, a gate layer, an interlayer insulating layer 224, a source-drain layer, and a passivation layer 226 are sequentially stacked in order from bottom to top; the active layer is patterned to form an active area 221, and the area 221 is doped to form a channel area in the middle and doped areas on both sides; the gate insulating layer 222 covers the active area 221 and the flexible substrate 210; the gate layer is patterned to form the gate 223, and the gate 223 and the channel area in the source area 221 corresponds; the interlayer insulating layer 224 covers the gate 223 and the gate insulating layer 222; the source and drain layers are patterned to form the source and drain 225, and the source or drain is connected to the doped region in the active region through a via in the interlayer insulating layer 224 and the gate insulating layer 222; and the passivation layer 226 covers the source and drain electrodes 225 and the interlayer insulating layer 224. The active area 221, the gate 223, and the source and drain 225 together form a thin film transistor. The thin film transistor is a main component of a driving circuit and is used to drive pixels in a display panel to emit light. The flexible substrate 210 and the thin film transistor layer 220 together constitute a flexible driving circuit substrate 200.

A support plate 20 is attached to the array substrate 10 to support the OLED display panel. The size of the support plate 20 is slightly smaller than the size of the display area 101. The support plate 20 may be a glass substrate or a polymer substrate made of a material such as polyimide, polyethylene terephthalate, or polyaluminum chloride.

A light emitting functional layer 30 is formed on the array substrate 10 and includes a pixel electrode layer on the passivation layer 226. The pixel electrode layer is patterned to form the pixel electrode 301. The pixel electrode 301 passes through the via hole in the passivation layer 226, and the source or drain of the corresponding thin film transistor is connected; a pixel definition layer 302 formed on the passivation layer 226 and the source and drain 225, and the pixel definition layer 302 is patterned to form a light emitting definition area, which is located at right above the pixel electrode 301; a luminescent material layer 303 is formed in a light-emitting area for light-emitting display, and includes a hole-injection layer, a hole-transport layer, a light-emitting layer, an electron-transport layer, and an electron-injection layer from bottom to top; and the common electrode 304 which covers the luminescent material layer 303 and the pixel definition layer 302 is provided on the entire surface.

An encapsulation layer 40 comprises a first inorganic encapsulation layer, a second inorganic encapsulation layer, and an organic encapsulation layer located between the first inorganic encapsulation layer and the second inorganic encapsulation layer. The encapsulation layer 40 is used to encapsulate and protect the entire OLED display panel.

An area where the data driving circuit, the gate driving circuit, and the electrostatic discharge circuit are provided in the flexible driving circuit substrate 200 is bonded to the other surface of the support plate 20 after being partially bent.

In one embodiment, the gate driving circuit is disposed in an area of one of the left and right side of the display area of the flexible driving circuit substrate 200. The gate driving circuit may be provided in an area located on the left side of the display area, or may be provided in an area located on the right side of the display area; and the area where the flexible driving circuit substrate 200 is provided with the gate driving circuit, the data driving circuit, and the electrostatic discharge circuit is bonded to the other surface of the support plate 20 after being partially bent.

In another embodiment, the gate driving circuit is disposed in areas on the left and right side of the display area of the flexible driving circuit substrate 200, and the areas on the left and right side are attached to the other side of the support plate 20 after being partially bent.

In one embodiment, the flexible driving circuit substrate 200 is also provided with an electrostatic discharge circuit. When the gate driving circuit is disposed in an area on one of the left and right side of the display area of the flexible driving circuit substrate 200, the electrostatic discharge circuit is disposed in at least one of an area on a side of the display area where the gate driving circuit is not provided and is disposed in an area on an upper side of the display area. The flexible driving circuit substrate 200 is provided with an area of the gate driving circuit, the data driving circuit, and the electrostatic discharge circuit is bonded to the other surface of the support plate 20 after being partially bent.

When the gate driving circuit is disposed in the area on the left and right side of the display area of the flexible driving circuit substrate 200, the electrostatic discharge circuit is disposed in an area located on the upper side of the display area; and the area where the data driving circuit is provided, the area where the gate driving circuit is provided, and the area where the electrostatic discharge circuit is provided are flexibly bonded to the other surface of the support plate 20 through the partial driving circuit substrate 200.

Figure 7:
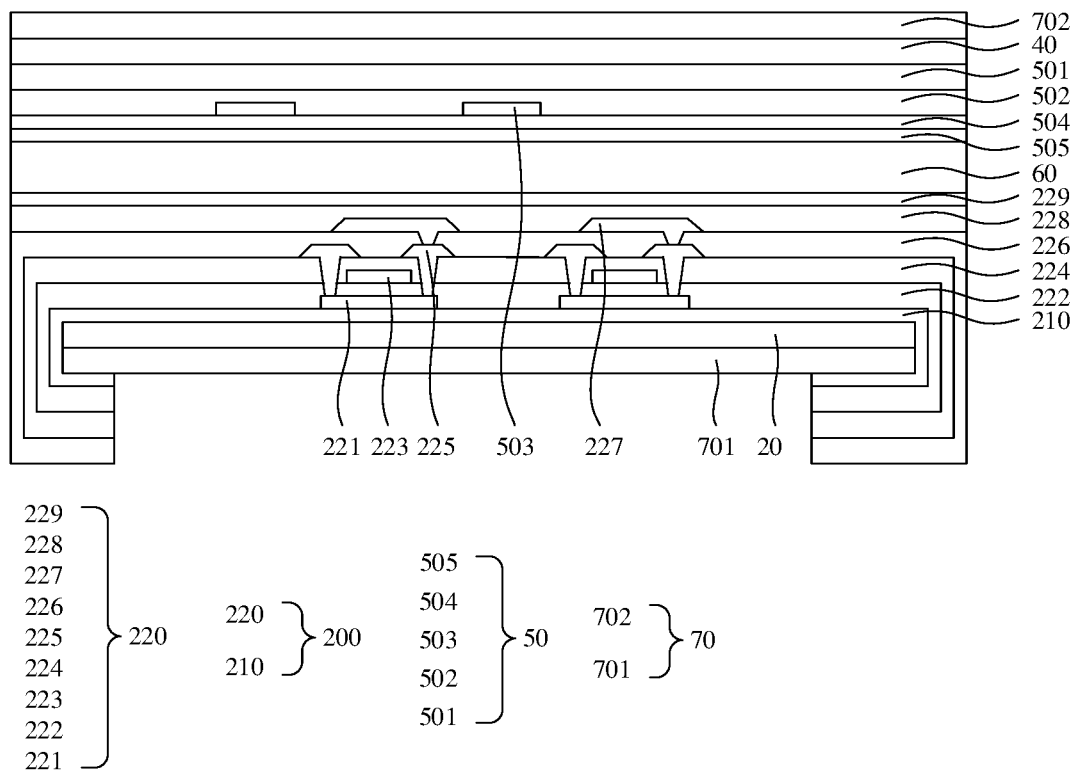
FIG. 7 is a schematic diagram of a second structure of the display panel provided by an embodiment of the present application.

In one embodiment, the display panel provided in this application is an LCD display panel. As shown in FIG. 7, the LCD display panel comprises:

An array substrate 10 comprises a flexible substrate 210 and a thin film transistor layer 220. The thin film transistor layer 220 comprises an active layer 221, a gate insulating layer 222, a gate layer, an interlayer insulating layer 224, a source/drain electrode layer 225, a passivation layer 226, a pixel electrode 227, a planarization 228, and a first alignment film 229 which are sequentially stacked from bottom to top. The drain layer 225, the passivation layer 226, the pixel electrode 227, the planarization layer 228, and the first alignment film 229. The flexible substrate 210 and the thin film transistor layer 220 together constitute a flexible driving circuit substrate 200.

A support plate 20 is attached to the array substrate 10 to support the OLED display panel. The size of the support plate 20 is slightly smaller than the size of the display area 101. The support plate 20 may be a glass substrate or a polymer substrate made of a material such as polyimide, polyethylene terephthalate, or polyaluminum chloride.

A color film substrate 50 comprises a color film substrate 501, a black matrix layer 502, a photoresist layer 503, a common electrode layer 504, and a second alignment film 505, which are sequentially arranged from top to bottom. The black matrix layer 502 is patterned to form a photoresist layer. The photoresist layer includes a red photoresist, a green photoresist, and a blue photoresist. The photoresist layer is repeatedly filled in the photoresist area formed by the photoresist layer.

A liquid crystal layer 60 is filled between the array substrate 10 and the color filter substrate 50.

An encapsulation layer 40 comprises a first inorganic encapsulation layer, a second inorganic encapsulation layer, and an organic encapsulation layer located between the first inorganic encapsulation layer and the second inorganic encapsulation layer. The encapsulation layer 40 is used to encapsulate and protect the entire LCD display panel.

The polarizer 70 comprises a first polarizer 701 on the array substrate 10 side and a second polarizer 702 on the color filter substrate 50 side.

An area where the data driving circuit, the gate driving circuit, and the electrostatic discharge circuit are provided in the flexible driving circuit substrate 200 is bonded to the other surface of the support plate 20 after being partially bent.

In one embodiment, the gate driving circuit is disposed in an area of one of the left and right side of the display area of the flexible driving circuit substrate 200. The gate driving circuit may be provided in an area located on the left side of the display area, or may be provided in an area located on the right side of the display area; the area where the flexible driving circuit substrate 200 is provided with the gate driving circuit, the data driving circuit, and the electrostatic discharge circuit is bonded to the other surface of the support plate 20 after being partially bent.

In another embodiment, the gate driving circuit is disposed in areas on the left and right side of the display area of the flexible driving circuit substrate 200, and the areas on the left and right side are attached to the other side of the support plate 20 after being partially bent.

In one embodiment, the flexible driving circuit substrate 200 is also provided with an electrostatic discharge circuit. When the gate driving circuit is disposed in an area on one of the left and right side of the display area of the flexible driving circuit substrate 200, the electrostatic discharge circuit is disposed in at least one of an area on a side of the display area where the gate driving circuit is not provided, and an area on an upper side of the display area; the area where the flexible driving circuit substrate 200 is provided with the gate driving circuit, the data driving circuit, and the electrostatic discharge circuit is bonded to the other surface of the support plate 20 after being partially bent.

When the gate driving circuit is disposed in the area on the left and right side of the display area of the flexible driving circuit substrate 200, the electrostatic discharge circuit is disposed in an area located on the upper side of the display area; and the area where the data driving circuit is provided, the area where the gate driving circuit is provided, and the area where the electrostatic discharge circuit is provided are flexibly bonded to the other surface of the support plate 20 through the partial driving circuit substrate 200.

Figure 8:
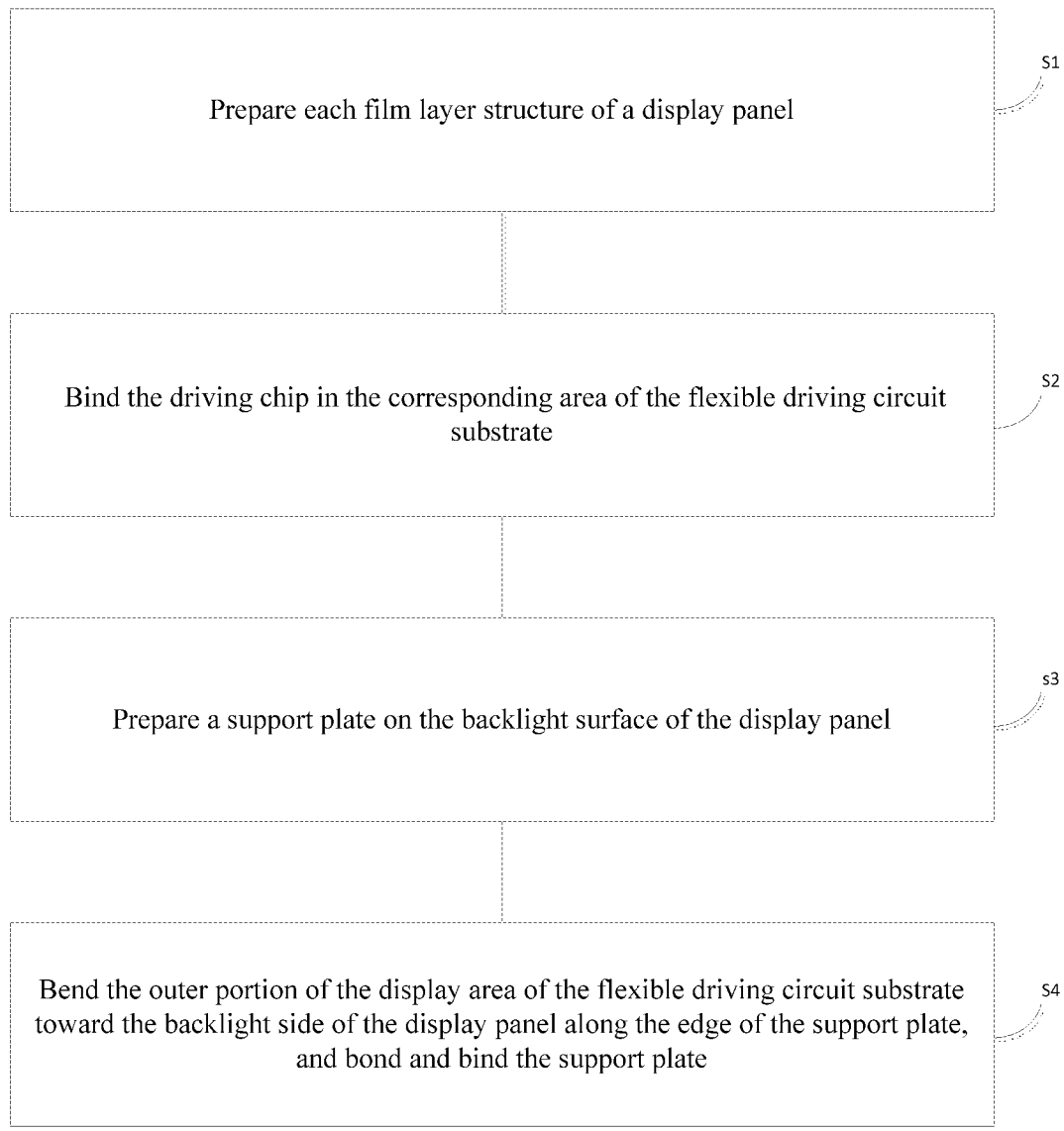
FIG. 8 is a schematic diagram of manufacturing the display panel according to an embodiment of the present application.

In one embodiment, as shown in FIG. 8, the present application provides a method for manufacturing a display panel which comprises:

S1. Prepare each film layer structure of a display panel.

Specifically, it is a flexible driving circuit substrate on a glass substrate; when the display panel is an OLED display panel, the method further includes sequentially preparing a pixel electrode layer, a pixel definition layer, a light-emitting material layer, a common electrode layer, and a packaging layer on the flexible driving circuit substrate. When the display panel is an LCD display panel, the method further includes preparing a pixel electrode layer, a planarization layer, and a first alignment film on a flexible driving circuit substrate, preparing a color film substrate, and aligning the color film substrate and the array substrate with each other. The color film substrate is filled with liquid crystals; finally, the display panel is packaged.

S2. Bind the driving chip in the corresponding area of the flexible driving circuit substrate.

Specific steps are: using an anisotropic conductive adhesive to bind the driving chip and the corresponding area of the flexible driving circuit substrate.

When the display panel is an LCD display panel, before performing step S3, the first polarizer and the second polarizer need to be laminated on the array substrate side and the color filter substrate side of the display panel, respectively.

S3. Prepare a support plate on the backlight surface of the display panel.

In one embodiment, specific steps for preparing the support film are: using a laser lift-off technique to peel the glass substrate located outside the panel display area, and the remaining glass substrate is the support plate. This support plate needs to be further deburred.

In another embodiment, specific steps for preparing the support film are: using a laser peeling technique to peel the entire glass substrate, and bonding a support plate in the panel display area and the backlight side of the display panel. The support plate may be a glass substrate. The substrate may also be a polymer substrate made of materials such as polyimide, polyethylene terephthalate, or polyaluminum chloride.

S4. Bend the outer portion of the display area of the flexible driving circuit substrate toward the backlight side of the display panel along the edge of the support plate, and bond and bind the support plate.

The embodiment of the present application provides a method for manufacturing a display panel. By setting the array substrate in the display panel to be flexible and binding a portion of the display panel that does not display to a backlight side of the display panel, it can be achieved that the light emitting surface of the display panel is only the displaying part of the display panel, thereby achieving a full screen with a very high screen ratio and solving the problem that existing display panels cannot be fully displayed.

And in the preparation method provided in the embodiment of the present application, in the preparation of each film layer structure of S 1, technical means can be the only thing to be taken into consideration in preparing a display panel with better performance, and the improvement of screen ratio of the panel can be dealt with in the subsequent process. This substantially improves the quality of the display panel and the binding yield of the driving chip.

In one embodiment, the present application provides a display device. The display device comprises a display panel. The display panel comprises a support plate; an array substrate comprising a flexible driving circuit substrate provided with a pixel driving circuit located in a display area, a gate driving circuit located in an area of at least one of the left and right side of the display area, and a data driving circuit located in an area below the display area; a backlight surface of the flexible driving circuit substrate is bonded to the support plate in the display area; and an area of the flexible driving circuit substrate provided with the gate driving circuit and the data driving circuit is bonded to the other surface of the support plate after being partially bent.

In an embodiment, the gate driving circuit is disposed in an area located on one of the left and right side of the display area; and the area where the gate driving circuit is disposed is bonded to the other surface of the support plate after being partially bent.

In another embodiment, the gate driving circuit is disposed in areas located on the left and right side of the display area; and the areas where the gate driving circuit is disposed are bonded to the other surface of the support plate after being partially bent.

In an embodiment, the flexible driving circuit substrate is also provided with an electrostatic discharge circuit.

In an embodiment, the gate driving circuit is disposed in an area located on one of the left and right side of the display area; the electrostatic discharge circuit is disposed in at least one of an area located on a side of the display area where the gate driving circuit is not provided, and an area located on an upper side of the display area; and an area where the electrostatic discharge circuit is provided is bonded to the other surface of the support plate after being partially bent.

In another embodiment, the gate driving circuit is disposed in areas located on the left and right side of the display area, the electrostatic discharge circuit is disposed in an area located on the upper side of the display area, and an area where the electrostatic discharge circuit is provided is bonded to the other surface of the support plate after being partially bent.

In an embodiment, the size of the support plate is smaller than the size of the display area.

In an embodiment, the material of the support plate is any one of glass, polyimide, polyethylene terephthalate, or polyaluminum chloride.

In an embodiment, the flexible driving circuit substrate comprises a flexible substrate and a thin film transistor layer, and the pixel driving circuit is composed of thin film transistors in the thin film transistor layer.

According to the above embodiment, it can be known that: the application provides an array substrate, a display panel, and a display device. The array substrate comprises a substrate and a flexible driving circuit substrate. The display panel comprises a support plate and the array substrate. The array substrate comprises a flexible driving circuit substrate and a backlight surface of the flexible driving circuit substrate is bonded to the support plate in the display area. An area of the flexible driving circuit substrate provided with the gate driving circuit and the data driving circuit is bonded to the other surface of the support plate after being partially bent. In this way, only the display area of the display panel can be maintained on the light emitting surface of the display panel, which greatly improves the screen ratio of the entire display panel and alleviates the problem that the existing display panel cannot be fully displayed.

In summary, although the present application has been disclosed above with preferred embodiments, the above preferred embodiments are not intended to limit the application. Those skilled in the art can make various modifications without departing from the spirit and scope of the application. This kind of modification and retouching, so the protection scope of this application shall be subject to the scope defined by the claims.

What is claimed is:

1. A display panel, comprising:
   a support plate;
   an array substrate comprising a flexible driving circuit substrate provided with a pixel driving circuit located in a display area, a gate driving circuit located in an area of at least one of left and right side of the display area, and a data driving circuit located in an area below the display area; a backlight surface of the flexible driving circuit substrate bonded to the support plate in the display area; and an area of the flexible driving circuit substrate provided with the gate driving circuit and the data driving circuit bonded to other surface of the support plate after being partially bent.

2. The display panel of claim 1, wherein the gate driving circuit is disposed in an area located on the left and right side of the display area.

3. The display panel of claim 1, wherein a size of the support plate is smaller than a size of the display area.

4. The display panel of claim 1, wherein material of the support plate is any one of glass, polyimide, polyethylene terephthalate, or polyaluminum chloride.

5. The display panel of claim 1, wherein the flexible driving circuit substrate comprises a flexible substrate and a thin film transistor layer, and the pixel driving circuit is composed of thin film transistors in the thin film transistor layer.

6. The display panel of claim 1, wherein the gate driving circuit is disposed in an area located on one of the left and right side of the display area.

7. The display panel of claim 6, wherein the gate driving circuit is disposed in an area located on the left side of the display area.

8. The display panel of claim 6, wherein the gate driving circuit is disposed in areas located on the right side of the display area.

9. The display panel of claim 1, wherein the flexible driving circuit substrate is also provided with an electrostatic discharge circuit.

10. The display panel of claim 9, wherein the gate driving circuit is disposed in an area located on one of the left and right side of the display area; the electrostatic discharge circuit is disposed in an area located on a side of the left and right side of the display area where the gate driving circuit is not provided, and at least one of areas located on an upper side of the display area; an area where the electrostatic discharge circuit is provided is bonded to the other surface of the support plate after being partially bent.

11. The display panel of claim 9, wherein the gate driving circuit is disposed in areas located on the left and right side of the display area, and the electrostatic discharge circuit is disposed in an area located on the upper side of the display area; and an area where the electrostatic discharge circuit is provided is bonded to the other surface of the support plate after being partially bent.

12. A display device, comprising a display panel wherein the display panel comprises:
   a support plate;
   an array substrate comprises a flexible driving circuit substrate provided with a pixel driving circuit located in a display area, a gate driving circuit located in an area of at least one of left and right side of the display area, and a data driving circuit located in an area below the display area; a backlight surface of the flexible driving circuit substrate is bonded to the support plate in the display area; an area of the flexible driving circuit substrate provided with the gate driving circuit and the data driving circuit is bonded to other surface of the support plate after being partially bent.

* * * * *